(12) United States Patent
Price et al.

(10) Patent No.: US 6,545,551 B1
(45) Date of Patent: Apr. 8, 2003

(54) RADIATION HARDENED TIMER

(75) Inventors: Daniel L. Price, Ellettsville, IN (US); David E. Valadez, Carmel, IN (US); Clyde Mark Miller, Bloomington, IN (US); Jeff R. Johann, Bloomington, IN (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 0 days.

(21) Appl. No.: 09/944,092

(22) Filed: Sep. 4, 2001

(51) Int. Cl.[7] ............................................... H03L 7/06
(52) U.S. Cl. ................................... 331/49; 331/74
(58) Field of Search ....................... 331/49, 74; 702/8; 250/267, 494.1

(56) References Cited

U.S. PATENT DOCUMENTS 4,687,622 A * 8/1987 Longden ..................... 376/254
4,695,808 A * 9/1987 Cabaniss et al. ........ 331/177 R
6,327,549 B1 * 12/2001 Bingham et al. ........... 356/326

* cited by examiner

Primary Examiner—Tuan T. Lam
Assistant Examiner—Linh Nguyen
(74) Attorney, Agent, or Firm—John Tarlano

(57) ABSTRACT

A radiation hardened timer that keeps accurate time before, during and after passage through a radiation-containing environment, the radiation hardened timer having a first oscillator that is stable in a radiation-free environment, a second oscillator that is stable in a radiation-containing environment, and digital circuitry that interfaces the two oscillators.

2 Claims, 4 Drawing Sheets

| OUTPUT COUNT | DELTA MIRROR | LAST STATE COUNT |
|---|---|---|
| 0000000000000000 | 1010100000000000 | 0000000000000000 |
| 0000100000000000 | 1010100000000000 | 1111100000000000 |
| 0001100000000000 | 1010100000000000 | 1110100000000000 |
| 0010000000000000 | 1010100000000000 | 1110000000000000 |
| 0010100000000000 | 1010100000000000 | 1101100000000000 |
| 0011100000000000 | 1010100000000000 | 1100100000000000 |
| . . . | | |
| 0100100000000000 | 1010100000000000 | 1011100000000000 |
| 0101100000000000 | 1010100000000000 | 1010100000000000 |
| 0110000000000000 | 1010100000000000 | 1010000000000000 |
| 0110100000000000 | 1010100000000000 | 1001100000000000 |
| 0111100000000000 | 1010100000000000 | 1000100000000000 |
| . . . | | |
| 1000000000000000 | 1010100000000000 | 1000000000000000 |
| . . . | | |
| 1000100000000000 | 1010100000000000 | 0111100000000000 |
| 1001100000000000 | 1010100000000000 | 0110100000000000 |
| 1010000000000000 | 1010100000000000 | 0110000000000000 |
| 1010100000000000 | 1010100000000000 | 0101100000000000 |
| 1011100000000000 | 1010100000000000 | 0100100000000000 |
| . . . | | |
| 1100100000000000 | 1010100000000000 | 0011100000000000 |
| 1101100000000000 | 1010100000000000 | 0010100000000000 |
| 1110000000000000 | 1010100000000000 | 0010000000000000 |
| 1110100000000000 | 1010100000000000 | 0001100000000000 |
| 1111100000000000 | 1010100000000000 | 0000100000000000 |
| . . . | | |
| 1111111111111111 | 1010100000000000 | 0000000000000001 |

*FIG. 2*

RADIATION HARDENED TIMER

BACKGROUND OF THE INVENTION

Currently available high-stability timing references can be hardened to survive a high radiation dose rate environment, but cannot operate in such an environment. Timing references hardened to operate under high radiation dose rate are inherently less stable than needed for some high radiation applications.

The extremely high dose rate events of interest are of nanosecond to microsecond duration and the photocurrents they induce decay to negligible levels within milliseconds. It is therefore sufficient to shut down the highly stable reference for periods of a few milliseconds to a few hundred milliseconds. Timing references hardened to continue operation through such radiation events are sufficiently stable over such short periods. So the disclosed radiation-hardened timer, also referred to as RHT, employs a highly stable non-operate-through oscillator, a less stable operate-through oscillator, and a digital interface circuit between the two: The function of the interface circuit is to calibrate the less stable oscillator to the more stable one, and to select which of the two is used as the timing reference.

The two timing references are independent asynchronous oscillators operating at different frequencies. The highly stable oscillator frequency, $f_1$, is chosen to suit the needs of the system for which the RHT will serve as a time base. The radiation hardened oscillator frequency, $f_2$, is chosen to be slightly more than an integer multiple of $f_1$. Since the integer selected is the approximate ratio of the two frequencies, it shall subsequently be referred to as R. The RHT performance is improved by selecting R as large as possible, but the design is simplified if it is a power of two. For the prototype upon which this patent is based, R is four. The exact value of $f_2$ is chosen such that the maximum expected drift of $f_2$ will not allow it to drop below $R*f_1$.

If $f_2/f_2$ were exactly R, then $f_2$ would only need to be divided by R to be used as the timing reference. Since $f_1/f_2$ is actually slightly larger than R, the occasional divide by (R+1) is needed to correct for accumulated error. The calibration algorithm determines how often a divide by (R+1) is needed; the generation algorithm determines when the divisions by (R+1) are preformed. Together these two halves of the interface algorithm are called the Delta-Mirror Algorithm (DMA).

If $f_2/f_1$ were slightly less than R, then correcting for accumulated error would require the occasional divide by (R−1). This would result in an occasional clock cycle that was significantly shorter than expected. Such a short cycle could cause a setup time violation in a digital circuit, so $f_2$ is selected such that $f_2/f_1$ will never drop below R.

While in a benign environment, the highly stable oscillator signal is passed straight through as the RHT output. This signal also drives the output counter, a counter containing enough bits to count high enough to obtain the required system accuracy. For 1 PPM accuracy, as in the prototype, the output counter needs to be able to count to one million divided by R. This results in a million counts of the radiation hardened oscillator between successive roll-overs of this counter. An 18 bit counter can count up to 262144, so the prototype uses an 18 bit counter. Successive roll-overs of the output counter then define a time interval referred to as the "calibration interval" and the "correction interval". During this interval, the radiation hardened oscillator puts out slightly more than $R*2^{18}$ cycles, or just over one million. Division of the correction interval into more than a million segments, results in a timing accuracy of better than 1 PPM.

When the output counter rolls over, another counter, the backup counter, is reset to zero. The backup counter then counts pulses from the backup oscillator ($f_2$). The count of $f_2$ will reach 262144 R times and then count up to a small number by the next roll over of the output counter. This "small" number, called Delta, is the number of times the backup oscillator output would need to be divided by (R+1) to produce an output frequency of $f_1$. The backup register must contain enough bits to count to the largest possible value of Delta. For simplicity, the prototype uses an 18 bit register as the backup counter.

At output counter roll over, Delta is copied into another register, called the correction mask register, but with the bit order reversed. The least significant bit of Delta becomes the most significant bit of the correction mask, the second least significant becomes the second most significant, and so on. This reversal of the bit order is called the "mirror" function. Should a radiation event require circumvention of the reference oscillator before the next roll over of the output register, the mirror of Delta currently stored in the correction mask will be used to generate the output from the backup oscillator.

Since the prototype calibration interval is 262144 counts of the reference oscillator and the prototype reference oscillator is 11.7504 MHz, the RHT recalibrates itself approximately once every 22.3 mS.

SUMMARY OF THE INVENTION

The RHT consists of a radiation hardened backup oscillator ($f_2$) and an application specific integrated circuit (ASIC). There are with inputs to the ASIC from a reference oscillator, (the reference oscillator not being part of the RHT), from the backup oscillator, and from various controls.

The backup oscillator consists of a resonator employing only passive parts, and an amplifier which is actually an inverter gate and two input/output (I/O) drivers on the ASIC. The passive parts include a quartz crystal, resistors, capacitors, and inductors.

The ASIC is a Silicon On Insulator (SOI) process integrated circuit, specifically designed to enhance radiation hardness. Included in the ASIC are six counter/registers: the reference counter, the backup counter, the last state counter, the correction mask, the output counter, and the reference detector.

The size of the reference counter determines the accuracy of the RHT. The prototype employs an 18 bit counter, which when combined with an approximate frequency ratio, $f_2/f_1$, of 4 produces an accuracy of approximately 1 PPM.

The output counter, last state counter, and the correction mask must be the same size as the reference counter. The backup counter must be large enough to hold the largest likely value of delta and no larger than the reference counter. The prototype uses 18 bit registers for all five counters.

The logic connecting these registers is a synthsizable very-high-density-logic (VHDL) listing, implemented in both a Xilinx field-programmable-gate-array (FPGA) and in a Honeywell HX2000 Silicon-On-lnsulator (SOI) process ASIC.

The radiation hardened timer comprises an input from a reference oscillator of frequency $f_1$; a backup oscillator of frequency $f_2$, where $f_1$ and $f_2$ are asynchronous, and the nominal value of $f_2$ is slightly more than R times $f_1$, where R is an integer; an N bit wide digital register serving as an output counter; an N bit wide digital register serving as a last state counter; an N bit wide digital register serving as a correction mask; a count, called Delta, representing the difference between $f_2$ and R times $f_1$ according to the formula $f_2 \equiv (R+\text{Delta}/2^N)*f_1$, the approximation due only to the fact that R, Delta, and N are all integers; a digital register wide enough to hold the largest expected value of Delta, but no more than N bits wide, employed to count the backup oscillator output; a digital divider which nominally divides the backup oscillator signal by R, but which divides it by R+1 when the requirements of a Delta-Mirror algorithm are met; a detector circuit that senses the presence or absence of the reference oscillator signal at the reference oscillator input; and an adjudicator circuit that passes either the reference oscillator signal through as the output if it is available, or the divided down backup oscillator signal if the reference is unavailable.

DESCRIPTION OF THE DRAWING

FIG. 2 is a list of output counter counts generated by the output counter of the generator of FIG. 1. A representative Delta Mirror (the contents of the correction mask register) and a list of the last state counter are also included. The darkened bits in each line show the matching set of ones that trigger a correction pulse, i.e. a divide by 5 instead of four. Delta is $10101_{base\ 2}$ or $21_{base\ 10}$ for this example. As can be seen in FIG. 2, all 21 correction pulse counts are listed. The last state count is generated by starting both output and last state counters at zero, and then decrementing, the last state counter each time the output counter is incremented. This is equivalent to decrementing the current state of the output counter (hence the name "last state counter") and then inverting the result.

DESCRIPTION OF THE PREFERRED EMBODIMENT

Figure 1:
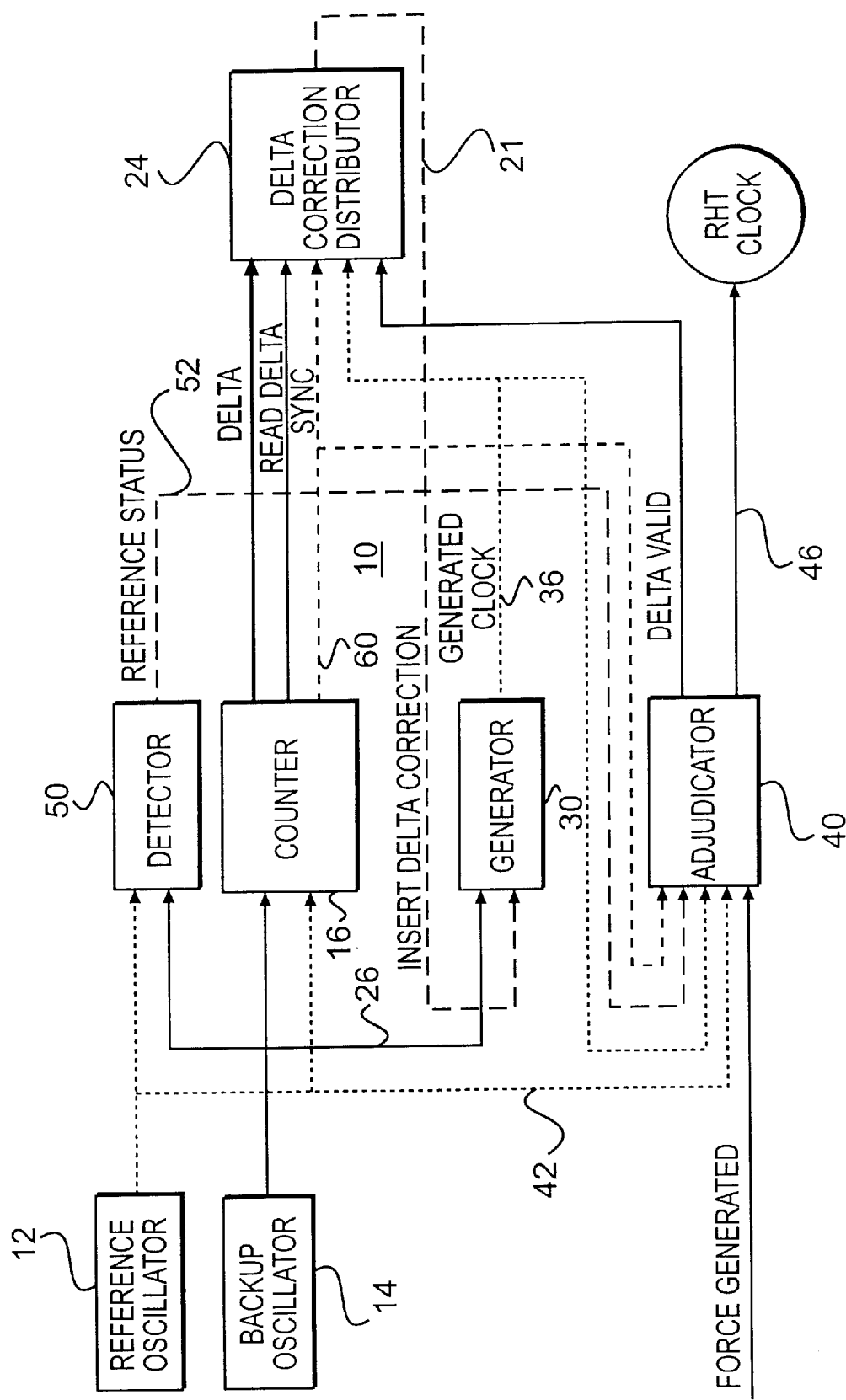
FIG. 1 is a block diagram of a radiation hardened timer. Each block is implemented as a block of synthsizable VHDL code.

FIG. 1 shows the Radiation Hardened Timer 10, also referred to as the RHT 10. FIG. 1 is a conceptual diagram of VHDL code. The specific implementation of the VHDL code in an ASIC will vary with manufacturer, process, and synthesis software revision. The VHDL code contains the design of FIG. 1.

The RHT 10 requires a reference oscillator 12, of frequency $f_1$. The reference oscillator 12 is not included as part of the RHT 10; instead, the system reference clock of the system in which the RHT 10 is employed will serve as the reference oscillator. The prototype of RHT 10 was designed to employ an 11.7504 MHz reference oscillator.

The RHT 10 includes a backup oscillator 14. The backup oscillator 14 is designed to operate at a frequency $f_2$ that is slightly more than R (R=4 for the prototype) times $f_1$. The design value of $f_2$ is 47.002272 MHz, which is as close as possible to $R*f_1$ while remaining large enough that the maximum expected drift of $f_2$ will not move it below $R*f_1$. The approximate relationship between $f_1$, $f_2$, and delta is: $f_2 \sim [R+(\text{Delta}/262144)]f_1$, where 262144 is the largest count of an 18-bit register ($2^{18}=262144$). The above relationship is still only approximate because only integer values of Delta are possible. The choice of 18 bit registers and R=4 insures that the above relationship is accurate to within the specified 1 PPM accuracy limits.

The output of the RHT 10 is counted in the output counter portion of counter 16, and in the last state counter portion of counter 16. The output counter portion of counter 16 is an 18-bit register that counts up to 262144 and then rolls over to zero. The last state counter portion of counter 16 is an 18-bit register that counts down from zero. So a count of 1 in the output counter corresponds to a count of 262144 in the last state counter, a count of 2 in the output counter corresponds to a count of 262143 in the last state counter portion, and so on. As a result, the last state counter portion always contains the inverse of one less than the output counter portion.

The output of the backup oscillator 14 is counted in the backup counter portion of counter 16. The backup counter portion of counter 16 is an 18-bit register that counts up to 262144 and then rolls over to zero. If the reference oscillator 12 is working, as indicated by the detector 50, the backup counter portion is read and reset to zero when the output counter portion rolls over;

The distributor 24 of FIG. 1 contains an 18-bit register portion called the correction mask register portion. When the backup counter portion is read at rollover of the reference counter portion, it's contents are written into the correction mask register portion with the bit order reversed; bit 0 becomes bit 17, bit 1 becomes bit 16, and so on. The value read from the backup counter portion at reference counter rollover is Delta, which is the number of times a divide by 5 must be done during each correction interval. The reversal of the bits as Delta is copied into the correction mask register portion is called the mirror function, from which the name "Delta Mirror Algorithm" is derived.

The output of the backup oscillator 14 is also counted in a divide-by-X counter portion located in the generator 30. The default value of X is 4, but X is occasionally 5 as described below. The output of the divide-by-X counter portion is used as the RHT output timing signal whenever the reference oscillator 12 is unavailable.

The distributor 24 compares the contents of the output counter portion, the last state counter portion, and the correction mask portion, to determine when a divide-by-5 is needed. When the output counter portion, the last state counter portion, and the correction mask portion, all have corresponding 1's in any bit, a divide by 5 is performed. FIG. 2 illustrates this for a representative Delta count of 21.

The adjudicator 40 passes either the signal from the reference oscillator 12 or the output of the generator 30, through as the RHT output. The detector 50 detects the presence or absence of the reference oscillator signal and passes that information on to the adjudicator 40. Whenever the reference oscillator 12 is absent, the adjudicator 40 passes the output of the generator 30 on as the RHT output.

When the reference oscillator signal returns, the adjudicator 40 switches back to the reference signal as soon as the current correction interval is finished. The correction interval ends when the output counter rolls over to zero.

Figure 3:
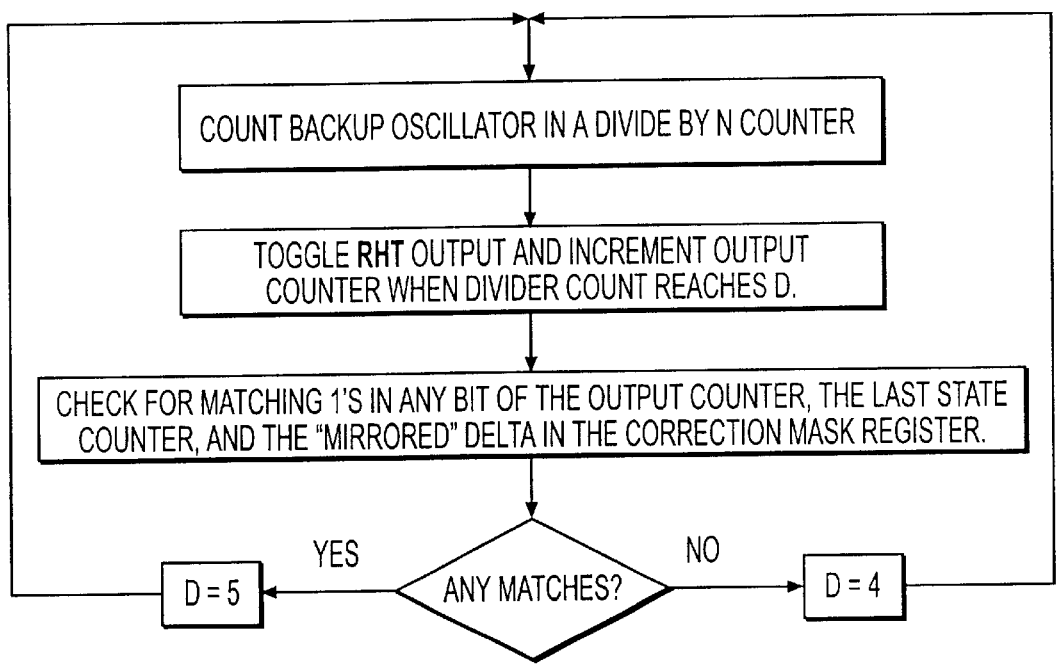
FIG. 3 is a flow diagram of the generation process. The approximate frequency ratio $f_2/f_1$ is 4, so the usual path is the divide by 4 path. When a match occurs as described in the chart, the divide by 5 path is taken. The generation algorithm runs whenever the reference oscillator quits, and produces an output that reproduces the reference signal to within specified accuracy.
Figure 4:
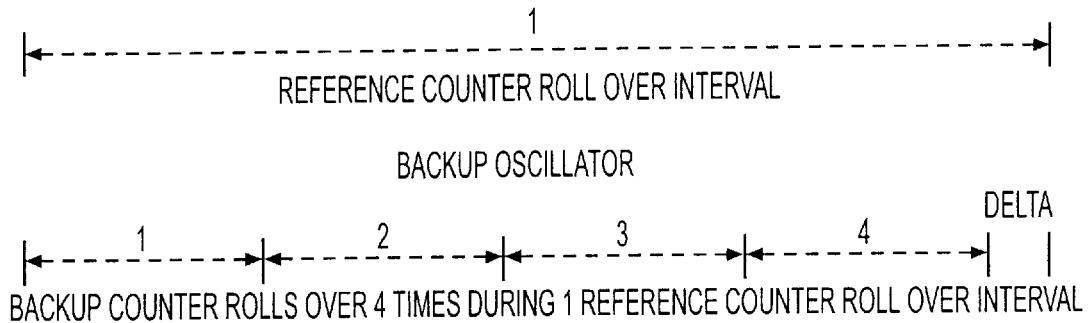
FIG. 4 is a relational diagram of a reference counter count interval of the reference counter of FIG. 1, to both a Delta count, and backup counter count intervals of the backup counter of FIG. 1.
Figure 5:
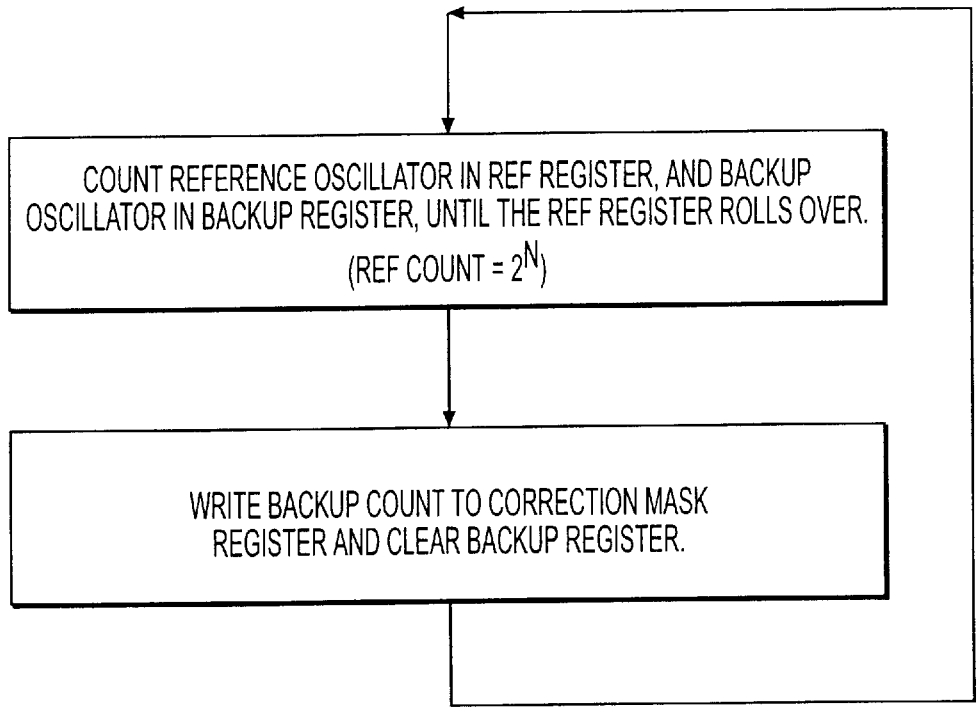
FIG. 5 is a flow diagram of the algorithm used to relate counts in the reference counter of FIG. 1, to counts in the backup counter of FIG. 1, to generate the Delta count. The Delta count is then placed in the correction mask located in the generator of FIG. 1.

FIG. 3 shows the flow of the generation algorithm. FIG. 5 shows the calibration algorithm. Together, these two processes make up the Delta-Mirror algorithm.

The calibration algorithm, FIG. 5, runs whenever the reference oscillator 12 is running. Every time the output counter portion rolls over, the counter 16 sends out the "Read Delta" and "Sync" pulses. This tells the distributor 40 to read the backup counter portion and place it's contents into the correction mask portion with the bit order reversed. With an 11.7504 MHz reference clock driving an 18-bit output counter portion, Delta is updated once every 22.309 mS.

The generation algorithm, FIG. 5, runs continuously whether the reference oscillator 12 is running or not. The generation algorithm employs the backup oscillator 14, the counter 16, the distributor 24, and the generator 30. The distributor continuously compares corresponding bits in the output counter portion, the last state counter portion, and the correction mask portion. If, as in FIG. 2, all three registers have corresponding ones in any bit position, the "Insert Delta Correction" signal is asserted telling the generator 30, to divide the signal from the backup oscillator 14 by 5 instead of 4. Because of the relationship between the output counter portion and the last state counter portion, the next value of the output counter portion will toggle the matching one to a zero. This de-asserts the "insert Delta Correction" signal, thus returning the generator 30 to dividing by 4.

If "reference status" is low, implying that the reference oscillator 12 is running, the generated clock signal is ignored; when "reference status" goes high, the adjudicator 40 passes it on as the RHT output until the next "sync" pulse after "reference status" goes low again. As a result, when the generated clock signal is in use, it is the signal counted in the output counter portion.

Details of the detector 50, counter 16, distributor 24, generator 30 and adjudicator 40 of FIG. 1 are as follows:

Detector
Inputs:
  Reference Oscillator—clock input
  Backup Oscillator—clock input
Outputs:
  Clock Status—active high, clock down
Purpose: Detect if Reference Oscillator is functioning
Functional Description: The Reference Oscillator is sampled with the faster Backup Oscillator. The frequency of the Backup Oscillator is approximately four times that of the Reference Oscillator. This sampled data is clocked into a 5-bit shift register by the Backup Oscillator. The data in the 5-bit register is analyzed. When the shift register contains data in the following states, the clock is considered down: 01010, 10101, 00000, 00001, 00010, 00100, 01000, 10000, 11110, 11101, 11011, 10111, 01111 or 11111. Clock Status goes high when any of the previous conditions are met.

Counter
Inputs:
  Reference Oscillator—clock input
  Backup Oscillator—clock input
Outputs:
  Delta—data bus
  Sync—active high pulse
  Read Delta—active high pulse
Purpose: Counts the number of Backup Oscillator cycles within a predetermined number (sampling interval) of Reference Oscillator cycles. Provides Backup Oscillator Delta to the Distributor.
Functional Description: The Delta provided is the difference between the expected number of Backup Oscillator cycles and the number actually counted. For the prototype this expected number was four times (4:1) the predetermined number of Reference Oscillator cycles. The frequencies of the oscillators were selected to produce a positive delta. When the Reference Oscillator counter revolves to the beginning of the sampling interval, a Sync pulse (one fast clock cycle) is produced. When the Sync pulse is produced, the Backup Oscillator Delta is stored and appears on the Delta bus. The Read Delta pulse (approximately one Reference Oscillator cycle) is produced during the next increment of the Reference Oscillator counter.

Distributor
Inputs:
  Delta—Backup Oscillator delta
  Generated Clock—clock input
  Read Delta—active high, pulse
  Sync—active high, pulse
  New Delta Cycle Complete—active high
Outputs:
  Insert Delta Correction—active high, pulse
Purpose: Distribute the Backup Oscillator delta count during the sampling interval.
Functional Description: The Sync pulse resets and synchronizes the Generated Clock. counter with the Reference Oscillator counter in the COUNTER block, otherwise the Generated Clock counter rolls over at the predetermined number. This is the same number as in the COUNTER block which defines the sampling interval. As the Generated Clock counter is incremented a binary count is provided for the distribution of the Backup Oscillator delta. The Backup Oscillator delta that appears on the Delta bus is read in when the Read Delta pulse is received and the New Delta Cycle Complete signal is active. The New Delta Cycle Complete signal becomes active after the COUNTER block completes a valid sample interval. This prevents a corrupt Delta value from being read. The "mirror" of the Delta binary value is created, this action switches the MSB with the LSB and all bits in-between respectively. A pulse (one cycle of the Generated Clock) on Insert Delta Correction is created each time a bit pattern matches the incrementing Generated Clock counter value. This bit pattern match is for every bit when its value is "1" and all bits down to the LSB are "0." Bits from the bit in question to the MSB are "don't care."

Generator
Inputs:
  Backup Oscillator—input clock
  Insert Delta Correction—active high, pulse
Outputs:
  Generated Clock—generated clock
Purpose: Generate a "backup clock" from the Backup Oscillator when Reference Oscillator is not functioning.
Functional Description: The basic function of the GENERATOR is to divide the Backup Oscillator input clock signal by four. When a Insert Delta Correction pulse is received an additional cycle of the Backup Oscillator is added to the created waveform. When the Insert Delta Correction input is not active the created waveform is "1100." When the Insert Delta Correction is active the created waveform is "11000." Each bit of the created waveform represents one cycle of the Backup Oscillator. These additonal Backup Oscillator cycles in the created waveform insure that the stored characteristics (Delta) of the Reference Oscillator are represented in the "backup clock" over this generated interval as were stored in the original sampling interval.

Adjudicator

Inputs:

Reference Clock—input clock

Generated Clock—input clock

Clock Status—active high

Sync—active high, pulse

Force Generated—active low

Outputs:

OTC Clock—passthrough of Reference Clock or Generated Clock

New Delta Cycle Complete—active high, asserted after two SYNC pulses have been detected Purpose: Determine which clock signal is passed to the output Functional Description: When Clock Status or Force Generated are active the Generated Clock is passed to the OTC Clock output, otherwise the Reference Clock is passed to the OTC Clock output. The New Delta Cycle Complete output is reset to inactive when the Clock Status signal is active. When the Clock Status is inactive, which means the Reference Clock has returned, the Reference Clock is directed to the OTC Clock output after the first Sync pulse is received. The New Delta Cycle Complete is set active after the second Sync pulse is received.

While the present invention has been disclosed in connection with the preferred embodiment thereof, it should be understood that there are other embodiments that fall within the spirit and scope of the invention as defined by the following claims.

What is claimed is:

1. A radiation hardened timer, comprising:

(a) an input from a reference oscillator of frequency $f_1$;

(b) a backup oscillator of frequency $f_2$, where $f_1$ and $f_2$ are asynchronous, and the nominal value of $f_2$ is more than R times $f_1$, where R is an integer;

(c) an N bit wide digital register serving as an output counter;

(d) an N bit wide digital register serving as a last state counter;

(e) an N bit wide digital register serving as a correction mask;

(f) a count, called Delta, representing the difference between $f_2$ and R times $f_1$ according to the formula $f_2 \equiv (R+\text{Delta}/2^N)*f_1$, the approximation due only to the fact that R, Delta, and N are all integers;

(g) a digital register wide enough to hold the largest expected value of Delta, but no more than N bits wide, employed to count the backup oscillator output; a digital divider which nominally divides the backup oscillator signal by R, but which divides it by R+1 when the requirements of a Delta-Mirror algorithm are met;

(h) a detector circuit that senses the presence or absence of the reference oscillator signal at the reference oscillator input; and (i) an adjudicator circuit that passes either the reference oscillator signal through as the output when it is available, or the divided down backup oscillator signal when the reference is unavailable.

2. The Delta-Mirror algorithm employed in the radiation hardened timer of claim 1, comprising:

(a) a calibration algorithm consisting of a count, in counters that roll over to zero when they reach their maximum value, of the reference signal and the backup signal to determine Delta, the difference between the backup count and R times the reference count when the reference count rolls over to zero;

(b) a generation algorithm which reverses the bit order of Delta in a register of the same size as the output register (called the correction mask), and then divides the backup clock oscillator signal by R nominally, or by R+1 when a zero to one transition occurs in any output counter bit corresponding to a one in the correction mask.

* * * * *